United States Patent
Zywno et al.

(10) Patent No.: US 7,342,238 B2
(45) Date of Patent: Mar. 11, 2008

(54) SYSTEMS, CONTROL SUBSYSTEMS, AND METHODS FOR PROJECTING AN ELECTRON BEAM ONTO A SPECIMEN

(75) Inventors: Marek Zywno, San Jose, CA (US);
Marian Mankos, Palo Alto, CA (US);
Harald Hess, La Jolla, CA (US);
Shem-Tov Levi, Palo Alto, CA (US)

(73) Assignee: KLA-Tenor Technologies Corp., Milpitas, CA (US)

( * ) Notice: Subject to any disclaimer, the term of this patent is extended or adjusted under 35 U.S.C. 154(b) by 302 days.

(21) Appl. No.: 11/198,985

(22) Filed: Aug. 8, 2005

(65) Prior Publication Data
US 2007/0029506 A1 Feb. 8, 2007

(51) Int. Cl.
*G01N 23/00* (2006.01)
(52) U.S. Cl. .............. 250/492.2; 250/492.1; 250/492.21; 250/492.22; 250/492.3
(58) Field of Classification Search ............. 250/492.1, 250/492.2, 492.21, 492.22, 492.23, 492.3
See application file for complete search history.

(56) References Cited

U.S. PATENT DOCUMENTS

| | | | |
|---|---|---|---|
| 6,555,830 B1 | 4/2003 | Mankos et al. | |
| 6,687,008 B1 | 2/2004 | Peale et al. | |
| 6,759,654 B1 | 7/2004 | Mankos et al. | |
| 6,870,172 B1 | 3/2005 | Mankos et al. | |
| 6,878,937 B1 | 4/2005 | Mankos | |
| 2004/0039760 A1 | 2/2004 | Hess et al. | |
| 2004/0125488 A1 | 7/2004 | Zhu et al. | |

*Primary Examiner*—Jack I. Berman
*Assistant Examiner*—Michael J Logie
(74) *Attorney, Agent, or Firm*—Baker & McKenzie LLP

(57) ABSTRACT

Systems, control subsystems, and methods for projecting an electron beam onto a specimen are provided. One system includes a stage configured to move the specimen with a non-uniform velocity. The system also includes a projection subsystem configured to project the electron beam onto the specimen while the stage is moving the specimen at the non-uniform velocity. In addition, the system includes a control subsystem configured to alter one or more characteristics of the electron beam while the projection subsystem is projecting the electron beam onto the specimen based on the non-uniform velocity. One method includes moving the specimen with a non-uniform velocity and projecting the electron beam onto the specimen during movement of the specimen. In addition, the method includes altering one or more characteristics of the electron beam during projection of the electron beam onto the specimen based on the non-uniform velocity.

23 Claims, 3 Drawing Sheets

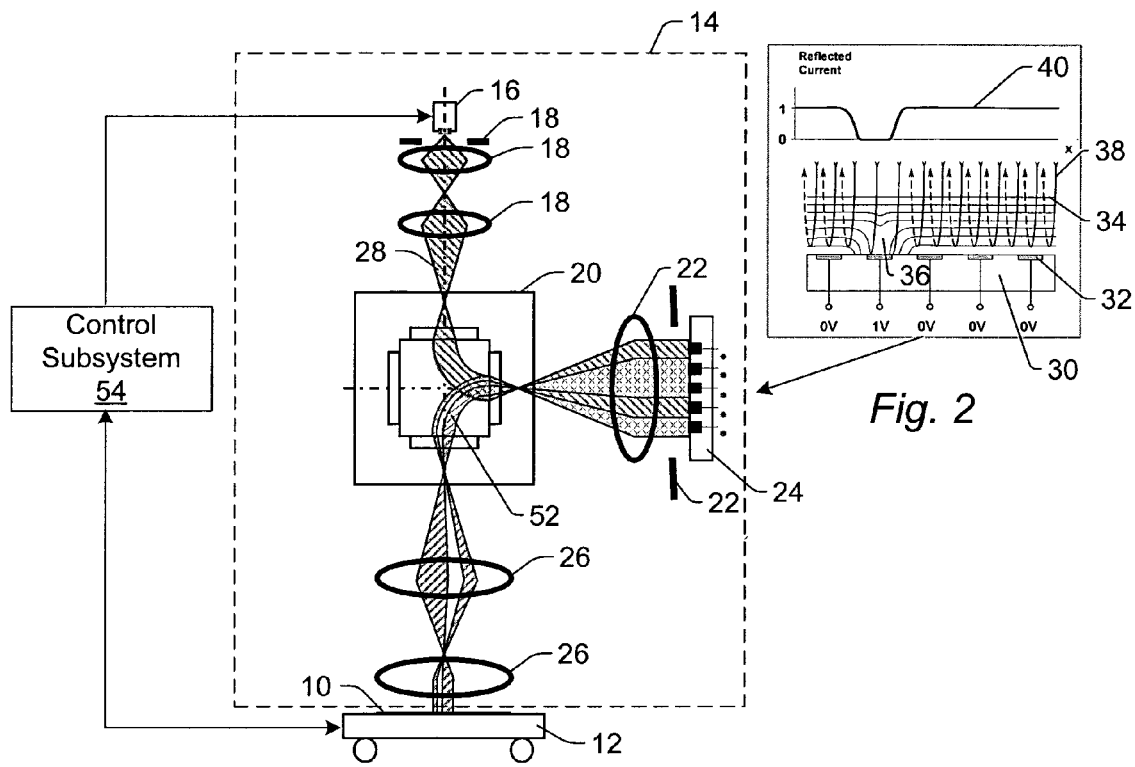
FIG. 1
Fig. 2
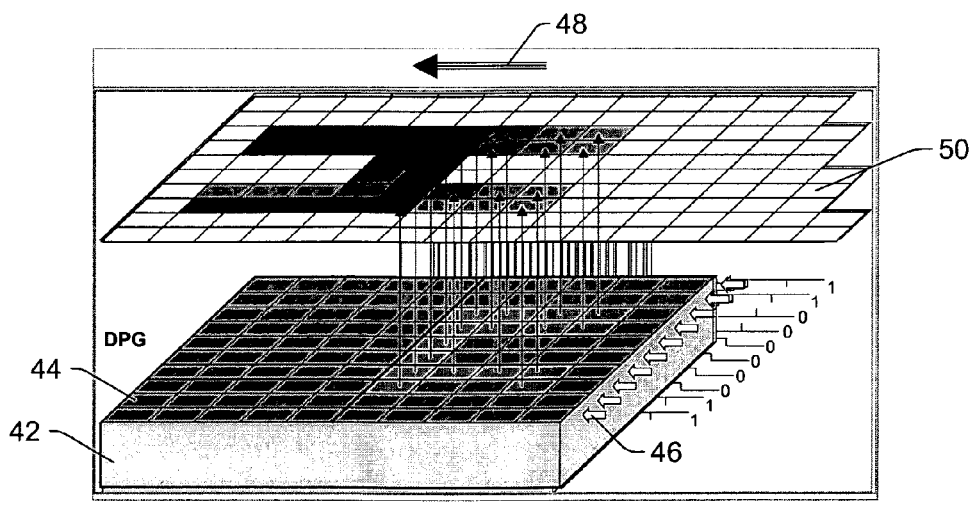
FIG. 3

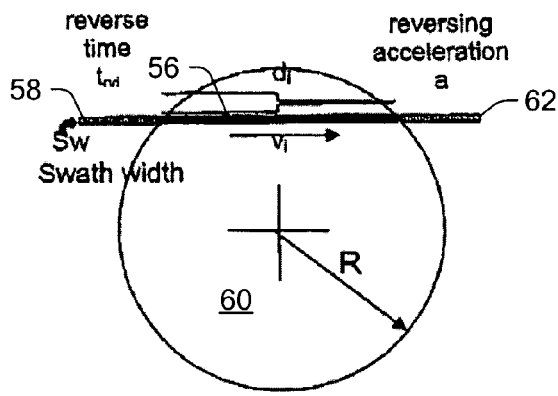
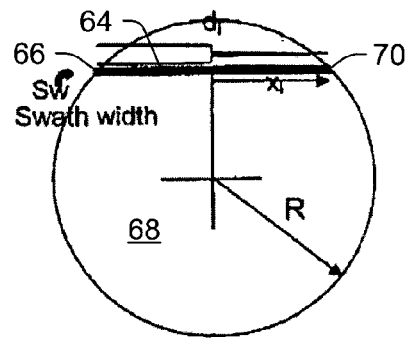
FIG. 4
FIG. 6
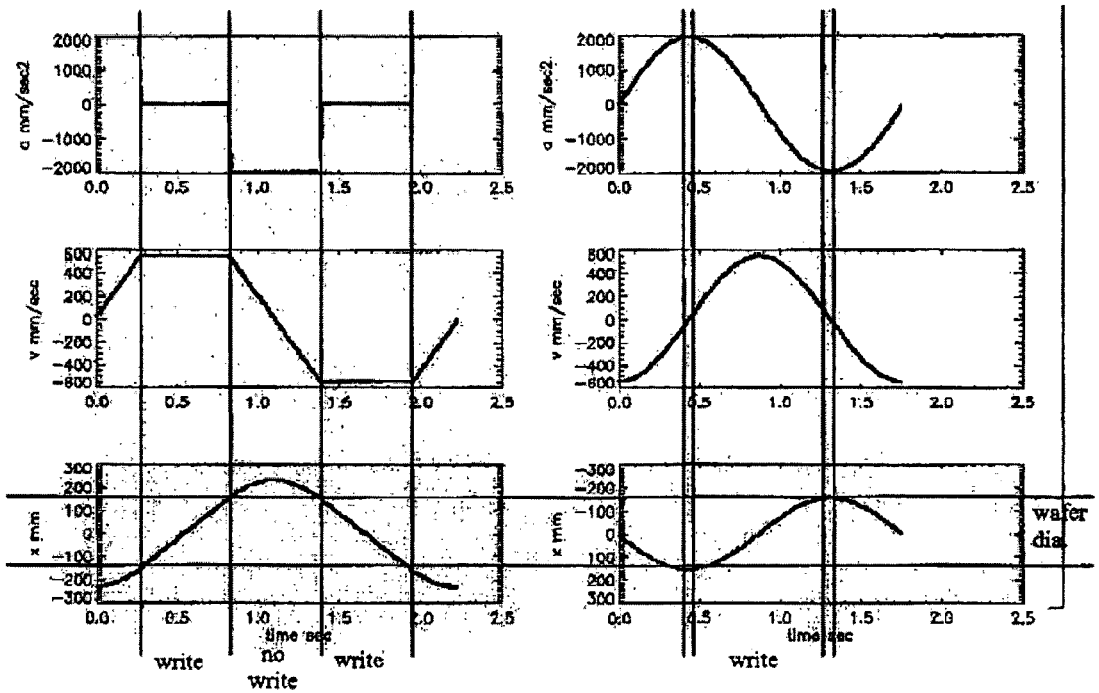
FIG. 5
FIG. 7

SYSTEMS, CONTROL SUBSYSTEMS, AND METHODS FOR PROJECTING AN ELECTRON BEAM ONTO A SPECIMEN

BACKGROUND OF THE INVENTION

1. Field of the Invention

This invention generally relates to systems, control subsystems, and methods for projecting an electron beam onto a specimen. Certain embodiments relate to a system that is configured to alter one or more characteristics of an electron beam during projection of the electron beam onto a specimen while the specimen is being moved at a non-uniform velocity.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a single semiconductor wafer and then separated into individual semiconductor devices.

A lithographic process, as described above, is performed to selectively remove portions of the resist thereby exposing underlying areas of the specimen on which the resist is formed for selective processing such as etching, material deposition, implantation, and the like. Therefore, in many instances, the performance of the lithography process largely determines the characteristics (e.g., dimensions) of the structures formed on the specimen. Consequently, the trend in lithography is to design systems and components (e.g., resist materials) that are capable of forming patterns having ever smaller dimensions. A large part of the effort in developing advanced lithography systems involves the design and development of exposure tools that expose the resist in a predetermined pattern. In particular, the resolution capability of the lithography tools is one primary driver of lithography research and development.

Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam. Such a lithography tool may be configured to scan the electron beam over the whole specimen in the form of lines, and the desired structure is written on the specimen by corresponding blanking of the beam. Alternatively, such a lithography tool may be configured to guide the focused electron beam over the regions of the resist to be exposed in a vector scan method. The beam spot may be shaped by a diaphragm. EBDW has relatively high flexibility since the circuit geometries are stored in a computer and can be optionally varied. Furthermore, very high resolutions can be attained by electron beam writing since electron foci with small diameters may be attained with electron-optical imaging systems. However, direct writing is disadvantageous in that the process is very time-consuming due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by projection optics. Since a whole field is imaged simultaneously in electron beam projection lithography, the attainable throughputs can be markedly higher in comparison with electron beam writers. One disadvantage of conventional electron beam projection lithography systems is that a corresponding mask is necessary for each structure to be exposed. Therefore, the preparation of customer-specific circuits in small numbers is not economic, because of the high costs associated with mask production.

As described above, electron beam lithography (or e-beam lithography) can be used to generate patterns on wafers and reticles. In either case, the specimen must be moved during lithography such that the pattern can be printed at different positions on the specimen. Typically, e-beam lithography is performed in a step-and-write method in which a field is written on a specimen (e.g., on a wafer or a multi-field reticle) then the specimen is moved to a new field position. During the writing of the field, the specimen may be stationary. Alternatively, a number of new e-beam lithography tools write with a continuous motion/uniform velocity approach. In such approaches, a swath is written on the specimen in one direction at a constant velocity. The velocity is reversed after each swath such that each swath is written in alternating directions.

Both the step-and-write method and the continuous motion/uniform velocity approach have disadvantages. For example, in the continuous motion/uniform velocity approach, the stage must be decelerated and accelerated to reverse the velocity of the stage between swaths. Therefore, constant velocity must be re-established after the stage reversal such that writing of the next swath can be performed at the constant velocity. During such deceleration and acceleration of the stage, the stage must be moved such that when constant velocity is re-established, the electron beam is positioned at the correct position with respect to the specimen (e.g., proximate to the edge of the specimen) where the next swath begins. Therefore, the range across which the stage is required to move (including the length of a swath and distances for acceleration and deceleration) would need to be larger (and perhaps significantly larger (e.g., 2× larger)) than the dimension of the specimen in the direction of the swath. As such, the range of movement required for the stage may increase the size of the lithography tool and/or limit the minimum achievable footprint of the lithography tool.

Potentially more important is that both of these methods have an idle write time either while moving to the next field or during the time when the velocity of the stage is reversed between one swath and the next. Consequently, if the writing speed is not a limiting factor (depending on writing current, swath width, and resist sensitivity), then mechanical considerations may limit the duty cycle. In fact, if the maximum acceleration of the specimen is the main constraint on the achievable duty cycle, then the optimal duty cycle (for fastest writing) can be as low as 50% where half of the time is spent writing at a high velocity and half of the time is idle while the specimen is accelerated to reverse the velocity at the end of each swath.

Electron beam systems are becoming increasingly relied upon not only in lithography, but also in the inspection of devices formed in semiconductor fabrication. For example, as the dimensions of semiconductor devices continue to shrink with advances in semiconductor materials and processes, the ability to detect defects having corresponding decreasing dimensions has become increasingly important in the successful fabrication of advanced semiconductor devices. Therefore, significant research continues to focus on increasing the resolution capability of tools that are used to examine microscopic features and defects. Optical microscopes generally have an inherent resolution limit of approximately 200 nm and have limited usefulness in current manufacturing processes. Microscopes that utilize electron beams to examine devices, however, may be used to detect defects and investigate feature sizes as small as, e.g., a few nanometers. Therefore, tools that utilize electron beams to inspect semiconductor devices are increasingly becoming relied upon in semiconductor fabrication processes. For example, in recent years, scanning electron microscopy has become increasingly popular for the inspection of semiconductor devices.

Scanning electron microscopy generally involves scanning an electron beam over a specimen and creating an image of the specimen by detecting electrons that are reflected and/or scattered by the specimen. Scanning of the electron beam over the specimen may be performed as described above. Therefore, electron beam-based inspection systems may suffer from the same disadvantages described above. For example, e-beam inspection systems may have an increased structure size due to the range of movement required for the stage and may have a duty cycle that is limited by the idle time needed to reverse the stage.

Accordingly, it would be advantageous to develop methods and systems for electron beam lithography and inspection that reduce the range of movement of a stage that moves a specimen during scanning thereby lowering spatial requirements in the systems for the stage movement and that are capable of higher duty cycles than those that are currently achievable thereby increasing the throughput and lowering the cost of electron beam based methods and systems.

SUMMARY OF THE INVENTION

The following description of various embodiments of systems, control subsystems, and methods is not to be construed in any way as limiting the subject matter of the appended claims.

One embodiment relates to a system configured to project an electron beam onto a specimen. The system includes a stage configured to move the specimen with a non-uniform velocity. The system also includes a projection subsystem configured to project the electron beam onto the specimen while the stage is moving the specimen at the non-uniform velocity. In addition, the system includes a control subsystem configured to alter one or more characteristics of the electron beam while the projection subsystem is projecting the electron beam onto the specimen based on the non-uniform velocity.

In one embodiment, the system is configured as a lithography system. In a different embodiment, the system is configured as an inspection system.

In some embodiments, the non-uniform velocity varies approximately sinusoidally. In another embodiment, the stage is configured to move the specimen over a distance that is not greater than approximately a size of the specimen.

In one embodiment, the control subsystem is configured to alter the one or more characteristics of the electron beam such that a dose of the electron beam projected onto the specimen is substantially constant during movement of the specimen. In another embodiment, the one or more characteristics of the electron beam include a pattern in which the electron beam is projected onto the specimen. In some embodiments, the control subsystem is configured to alter the one or more characteristics of the electron beam to compensate for heating of the specimen by the electron beam.

In an additional embodiment, the control subsystem is configured to dynamically determine a position of the specimen with respect to the electron beam during movement of the specimen. In a further embodiment, the control subsystem includes an optical subsystem configured to dynamically determine a position of the specimen with respect to the electron beam during movement of the specimen. In a different embodiment, the control subsystem includes an electron beam subsystem configured to dynamically determine a position of the specimen with respect to the electron beam during movement of the specimen.

In other embodiments, the control subsystem is configured to determine a position of the specimen with respect to the electron beam during movement of the specimen using predetermined empirical data. In yet another embodiment, the specimen includes servo patterns. In one such embodiment, the control subsystem includes a measurement subsystem configured to intermittently generate output signals responsive to the servo patterns. In addition, the control subsystem is configured to determine a position of the specimen or the stage from two or more of the output signals. Each of the embodiments of the system described above may be further configured as described herein.

Another embodiment relates to a control subsystem configured to be coupled to an electron beam projection system. The control subsystem is also configured to alter one or more characteristics of an electron beam projected onto a specimen by the electron beam projection system during movement of the specimen at a non-uniform velocity. The control subsystem may be further configured as described herein.

An additional embodiment relates to a method for projecting an electron beam onto a specimen. The method includes moving the specimen with a non-uniform velocity. The method also includes projecting the electron beam onto the specimen during movement of the specimen. In addition, the method includes altering one or more characteristics of the electron beam during projection of the electron beam based on the non-uniform velocity.

In one embodiment, the non-uniform velocity varies approximately sinusoidally. In another embodiment, moving the specimen is performed over a distance that is not greater than approximately a size of the specimen.

In an additional embodiment, altering the one or more characteristics of the electron beam includes altering the one or more characteristics of the electron beam such that a dose of the electron beam is substantially constant during projection of the electron beam onto the specimen. In a further embodiment, the one or more characteristics of the electron beam include a pattern in which the electron beam is projected onto the specimen. In some embodiments, altering the one or more characteristics of the electron beam includes altering the one or more characteristics of the electron beam to compensate for heating of the specimen by the electron beam.

In another embodiment, the method includes dynamically determining a position of the specimen with respect to the electron beam during movement of the specimen. In a different embodiment, the method includes determining a position of the specimen with respect to the electron beam during movement of the specimen using predetermined empirical data. In an additional embodiment, the specimen includes servo patterns. In one such embodiment, the method includes intermittently generating output signals responsive to the servo patterns. Such an embodiment of the method also includes determining a position of the specimen or the stage from two or more of the output signals. Each of the embodiments of the method described above may include any other step(s) described herein.

BRIEF DESCRIPTION OF THE DRAWINGS

Other objects and advantages of the invention will become apparent upon reading the following detailed description and upon reference to the accompanying drawings in which:

FIG. 1 is a schematic diagram illustrating a side view of one embodiment of a system configured to project an electron beam onto a specimen;

FIG. 2 is a schematic diagram illustrating how the projection subsystem of the system shown in FIG. 1 alters a pattern in which an electron beam is projected onto a specimen;

FIG. 3 is a schematic diagram illustrating a perspective view of one example of a pattern generator of the projection subsystem included in the system shown in FIG. 1;

FIG. 4 is a schematic diagram illustrating a constant velocity scan of an electron beam over a specimen;

FIG. 5 includes plots illustrating the acceleration, velocity, and position of an electron beam with respect to a specimen as a function of time for the constant velocity scan shown in FIG. 4;

FIG. 6 is a schematic diagram illustrating one embodiment of a non-uniform velocity scan of an electron beam over a specimen;

FIG. 7 includes plots illustrating the acceleration, velocity, and position of an electron beam with respect to a specimen as a function of time for the non-uniform velocity scan shown in FIG. 6.

Figure 8:
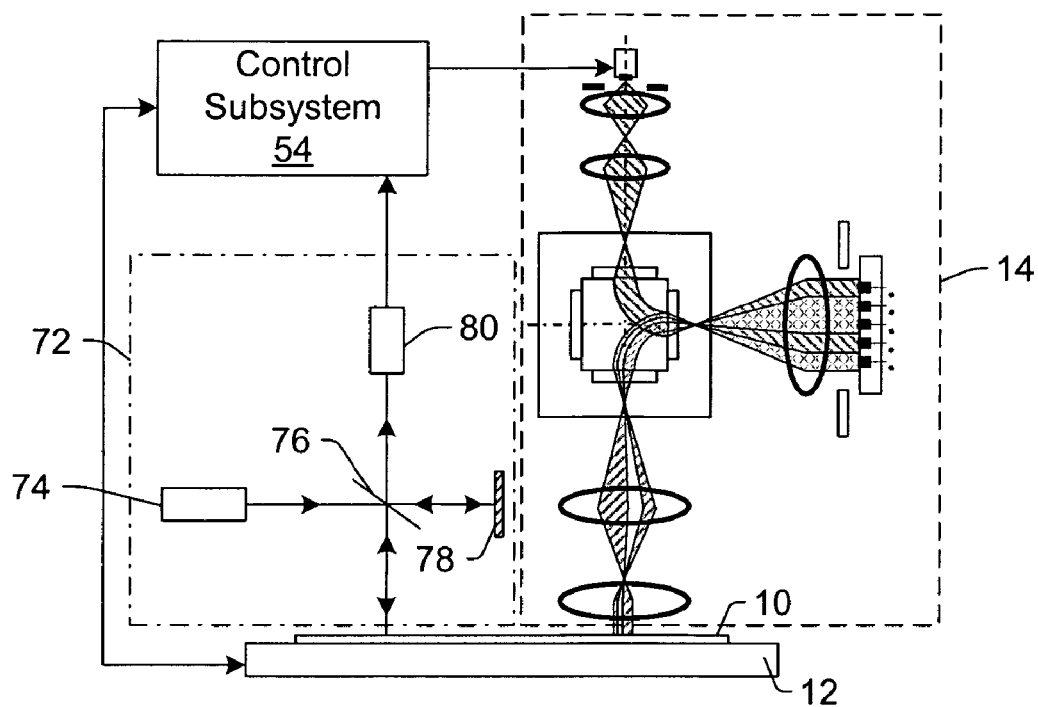
FIGS. 8 and 9 are schematic diagrams illustrating a side view of different embodiments of a system configured to project an electron beam onto a specimen.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "specimen" generally refers to a wafer or a reticle. The terms "reticle" and "mask" are used interchangeably herein. A reticle generally includes a transparent substrate such as glass, borosilicate glass, and fused silica having opaque regions formed thereon in a pattern. The opaque regions may be replaced by regions etched into the transparent substrate. Many different types of reticles are known in the art, and the term reticle as used herein is intended to encompass all types of reticles.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

FIG. 1 illustrates one embodiment of a system configured to project an electron beam onto specimen 10. The system includes stage 12 that is configured to support specimen 10 during projection of the electron beam onto the specimen. The stage is also configured to move specimen 10 with a non-uniform velocity as described further herein.

The stage may include any suitable mechanical or robotic assembly known in the art. In addition, the stage may be a MagLev stage.

The system also includes projection subsystem 14. Projection subsystem 14 is configured to project the electron beam onto specimen 10 while stage 12 is moving specimen 10 at the non-uniform velocity. Projection subsystem 14 includes electron source 16, illumination electron-optics 18, magnetic prism 20, objective electron-optics 22, dynamic pattern generator (DPG) 24, and projection electron-optics 26.

Electron source 16 may be configured to supply a relatively large current at relatively low brightness (current per unit area per solid angle) over a relatively large area. The large current allows the subsystem to have a high throughput rate. Preferably, the material of source 16 is configured to provide a brightness of about $10^4$ A/cm$^2$ sr or about $10^5$ A/cm$^2$ sr (Amperes per cm$^2$ steradian) at 50 keV beam energy. One example of an appropriate electron source is a LaB$_6$ source that has a brightness of about $10^6$ A/cm$^2$ sr at 50 keV beam energy. A different example of an appropriate electron source is a tungsten dispenser emitter, which typically has a brightness of about $10^5$ A/cm$^2$ sr when operating at 50 kV. Additional examples of an appropriate electron source include a tungsten Schottky cathode and heated refractory metal disks (i.e., tantalum, Ta).

Electron source 16 may also be configured to have a relatively low energy spread. The projection subsystem may be configured to control the energy of the electrons so that their turning points (the distance from DPG 24 at which they reflect) are relatively constant, for example, to within about 100 nm. To keep the turning points to within about 100 nm, electron source 16 preferably has an energy spread of no greater than about 0.5 electron volts (eV). $LaB_6$ emitters have typical energy spreads of about 0.5 eV to about 1 eV, and tungsten dispenser emitters have typical energy spreads of about 0.2 eV to about 0.5 eV. In one embodiment, electron source 16 includes a $LaB_6$ source or a tungsten Schottky emitter that is operated a few hundred degrees C. below its normal operating temperature to reduce the energy spread of the emitted electrons. However, cooler operating temperatures can destabilize source 16, for example, due to impurities settling on the source surface thereby diminishing its reliability and stability. Therefore, the source material may be selected to be a material in which impurities are unlikely to migrate to the surface thereby reducing choking off of the emission by the impurities. Moreover, the vacuum on the projection subsystem may be improved to overcome the impurity problem. Conventional lithography systems operate at a vacuum of $10^{-6}$ Torr. A scanning electron microscope (SEM) with a $LaB_6$ source typically operates at $10^{-7}$ Torr. A SEM with a Schottky emitter typically operates at $10^{-9}$ Torr or better in the gun region. In one configuration, the projection subsystem operates with a gun region vacuum of $10^{-9}$ Torr or lower to protect the stability of the electron source.

Illumination electron-optics 18 are configured to receive and collimate the electron beam from electron source 16. Illumination optics 18 allow setting of the current illuminating DPG 24 and therefore may be used to determine the electron dose used to expose specimen 10. Illumination optics 18 may include an arrangement of magnetic and/or electrostatic lenses configured to focus electrons from electron source 16 thereby generating incident electron beam 28.

Magnetic prism 20 is configured to receive incident electron beam 28 from illumination optics 18. When the incident beam traverses the magnetic fields of the prism, a force proportional to the magnetic field strengths acts on the electrons in a direction perpendicular to their trajectory (i.e., perpendicular to their velocity vectors). In particular, the trajectory of incident beam 28 is bent toward objective electron-optics 22 and DPG 24. In a preferred embodiment, magnetic prism 20 is configured with a non-uniform magnetic field to provide stigmatic focusing, for example, as disclosed in U.S. Pat. No. 6,878,937 to Mankos, which is incorporated by reference as if fully set forth herein. A uniform magnetic field provides astigmatic focusing where focusing occurs in only one direction (e.g., so as to image a point as a line). In contrast, magnetic prism 20 may be configured to focus in both directions (so as to image a point as a point) because prism 20 is also used for imaging. The stigmatic focusing of prism 20 may be implemented by dividing it into smaller sub-regions with different but uniform magnetic fields. Furthermore, the lens elements in prism 20 may have a relatively longer length and width to provide a low distortion image over a large field size. However, increasing he length of prism 20 involves a trade-off of more electron-electron interactions, which may cause more blur. Therefore, the reduced image distortion may be balanced against the increased blur when increasing the prism length.

Below magnetic prism 20, the electron-optical components of the objective optics are common to the illumination and projection electron-optics. Objective optics 22 may include an objective lens and one or more transfer lenses (not shown). The objective optics are configured to receive the incident beam from prism 20 and to decelerate and focus the incident electrons as they approach DPG 24. The objective optics are preferably configured (in cooperation with electron source 16, illumination optics 18, and prism 20) as an immersion cathode lens and are utilized to deliver an effectively uniform current density (i.e., a relatively homogenous flood beam) over a large area in a plane above the surface of DPG 24. In one specific implementation, the objective lens may be configured to operate with a system operating voltage of about 50 kV. Other operating voltages may be used in other configurations.

DPG 24 includes an array of pixels. Each pixel may include a metal contact to which a voltage level is controllably applied. DPG 24 may be coupled to a high voltage source (not shown) and a parallel data path (not shown). The parallel data path may be configured to carry control signals to DPG 24 for controlling the voltage on each pixel (so that it either absorbs or reflects electrons). The control signals may be adjusted so that the pattern moves electronically across the DPG pixel array in a manner that is substantially the same as the way signals move through a shift register and at a rate so as to match the linear movement of the specimen. In this manner, each exposed point on the specimen may receive reflected electrons from an entire column (or row) of DPG pixels, integrated over time. In one configuration, DPG 24 is configured to resemble a static random access memory (SRAM) circuit.

FIG. 2 illustrates the operation of DPG 24. In particular, FIG. 2 illustrates a cross-section of DPG substrate 30 and a column or row of pixels. Each pixel includes conductive area 32. A controlled voltage level is applied to each pixel. In the example shown in FIG. 2, four of the pixels are "off" and have 0 V applied thereto while one pixel is "on" and has 1 V applied thereto. The specific voltages that determine whether a pixel is off or on may vary depending on the parameters of the system. The resulting local electrostatic equipotential lines 34 are shown with distortions 36 relating to the off pixel. In this example, incident electrons 38 approaching DPG substrate 30 come to a halt in front of and are reflected by each of the on pixels, but the incident electrons are drawn into and absorbed by the off pixel. The resultant reflected current (in arbitrary units) is shown in graph 40. As seen in graph 40, the reflected current is 0 for the off pixel and 1 for the on pixels. The DPG substrate shown in FIG. 2 may be included in a DPG that is configured as described further herein. Although a certain number of pixels is shown in FIG. 2, the number of pixels may include any selected number of pixels.

FIG. 3 illustrates another embodiment of a DPG. As shown in FIG. 3, DPG substrate 42 includes a two dimensional array of pixels 44. Although a certain number of pixels is shown in FIG. 3, the number of pixels 44 may include any selected number of pixels. In one example, the array of pixels may include 4000 pixels along one dimension and 1000 pixels along the other dimension of the array. In such an embodiment, the DPG substrate may be configured such that data paths 46 are coupled to the pixels along one dimension of the array. In this manner, each of the data paths may provide a voltage to each of the pixels along this dimension of the array independently. In some embodiments, the 4000 pixels may be each coupled to one of the data paths. Therefore, the data paths may be configured as a 4000 channel data input. The frequency of the data input (and therefore the clock shifting rate of the DPG) may be about 10 MHz to about 50 MHz in one embodiment. In some embodiments, the voltages that are input to the pixels by the data paths may be transferred from pixel to pixel across the array by circuitry (not shown) contained within the DPG substrate. In this manner, the voltages input to the pixels may "roll" or move across the surface of the DPG substrate in the direction indicated by arrow 48. As such, pixels 50 on a specimen may be exposed in a "rolling" manner. The DPG substrate shown in FIG. 3 may be included in a DPG that is configured as described further herein.

Referring back to FIG. 1, the extraction part of the objective lens provides an extraction field in front of DPG 24. As reflected electrons 52 leave DPG 24, the objective optics are configured to accelerate reflected electrons 52 toward their second pass through prism 20. Prism 20 is configured to receive reflected electrons 52 from the transfer lens and to bend the trajectories of the reflected electrons toward projection optics 26.

Projection electron-optics 26 reside between prism 20 and stage 12. Projection optics 26 are configured to focus the electron beam and demagnify the beam onto specimen 10. The demagnification may range, for example, from about 1× to about 20× demagnification (i.e., about 1× to about 0.05× magnification). The blur and distortion of the electrons due to projection optics 26 is preferably a fraction of the pixel size. In one configuration, the pixel size may be, for example, about 22.5 nm. In such a case, projection optics 26 preferably have aberrations and distortions of less than about 10 nm to about 20 nm.

In one embodiment, the system shown in FIG. 1 is configured as a lithography system. In particular, the system is configured as a maskless reflection electron beam projection lithography system. In this manner, the system may be configured to expose a resist formed on a specimen in a predetermined pattern. The specimen may be a wafer or a reticle. Therefore, the system may be used in wafer and reticle manufacturing. In embodiments in which the system is configured as an electron beam lithography system, the projection subsystem shown in FIG. 1 may be further configured as described in U.S. Pat. No. 6,870,172 to Mankos et al. and U.S. patent application Ser. Nos. 10/851,041 filed May 21, 2004 by Hess et al. and 60/662,463 filed Mar. 16, 2005 by Bertsche et al., which are incorporated by reference as if fully set forth herein.

In an alternative embodiment, the system shown in FIG. 1 is configured as an inspection system. In such an embodiment, the projection subsystem may be configured as shown in FIG. 1, and various parameters of the projection subsystem may be selected for inspection. For example, the system configurations described above may be altered such that the electrons are provided to the specimen at a lower current and lower brightness than described above. These parameters may be selected such that inspection can be performed with relatively high sensitivity and relatively high throughput while avoiding changes in the specimen due to the electron beam. Parameters such as the current and brightness may be selected as described above (e.g., by selecting an appropriate electron source and/or controlling the dose of the electrons projected onto the specimen using illumination electron optics 18). The system may be configured to inspect the specimens described above such as wafers and reticles. In this manner, the system may be configured as a wafer inspection system or a reticle inspection system. Examples of electron beam based inspection systems are illustrated in U.S. Pat. No. 6,555,830 to Mankos et al., U.S. Pat. No. 6,759,654 to Mankos et al., and U.S. Pat. No. 6,878,937 to Mankos, which are incorporated by reference as if fully set forth herein. For embodiments in which the system is configured as an inspection system, the projection subsystem shown in FIG. 1 may be further configured as described in these patents.

Referring back to FIG. 1, the system includes control subsystem 54. Control subsystem 54 is configured to alter one or more characteristics of the electron beam projected onto specimen 10 while projection subsystem 14 is projecting the electron beam onto the specimen. In this manner, the system is configured to control the electron beam dynamically during writing or inspection performed during non-uniform velocity movement of the specimen. The one or more characteristics of the electron beam are preferably altered based on the non-uniform velocity at which the specimen is moved by stage 12. In a preferred embodiment, the control subsystem is configured to alter characteristic(s) of the electron beam to compensate for the non-uniform velocity such that the electrons may be projected on the specimen as desired for lithography or inspection. In this manner, unlike other systems, the system shown in FIG. 1 may be configured to write or inspect the specimen during continuous, but not uniform velocity, motion of the stage on which the specimen is supported. In other words, the system shown in FIG. 1 is configured to write or inspect a specimen during acceleration of the stage. In some cases, the writing or inspection may be performed during significant acceleration of the stage.

The systems described herein, therefore, provide a number of advantages over other currently used electron beam systems. For example, the systems described herein provide a 20% to 50% improvement in speed over present state of the art lithography systems. In this manner, the systems described herein remove a constraint on the throughput of electron beam lithography processes and provide ways to correct any complications that might result from writing during acceleration of the stage. Therefore, the systems described herein provide cost effective solutions for lithography applications since for new lithography systems to be cost effective the throughput needs to be as high as possible.

Such improvements in the speed of the electron beam systems described herein also benefit inspection applications in a similar manner. For instance, due to the relatively slow throughput of current electron beam inspection systems, electron beam inspection systems are not widely used to inspect entire specimens such as wafers. However, since the systems described herein provide higher throughput systems that may be used for inspection of a specimen, electron beam inspection may be more widely used for whole specimen inspection. In addition, since electron beam inspection provides higher resolution than many other currently used inspection systems (e.g., optical inspection systems), specimens such as wafers may be inspected using the systems described herein for smaller defects and in greater numbers while mitigating the reduction in throughput of the wafer fabrication process as a whole typically caused by conventional electron beam inspection. As such, the wafer fabrication process may be controlled more tightly by inspecting more wafers with higher resolution.

The systems described herein, unlike other currently used electron beam systems, can write or inspect while the stage is moving at a non-uniform velocity. As such, the stage does not have to move as far away from and toward the specimen during the turn around between swaths since a constant velocity does not have to be re-established before writing or inspection can begin. Therefore, in one embodiment, stage 12 shown in FIG. 1 is configured to move specimen 10 over a distance that is not greater than approximately a size of the specimen. For instance, the stage may move the specimen beyond the position of the electron beam only far enough such that the electron beam can be repositioned from the end of one swath to the beginning of the next swath. In this manner, if the stage has to move the specimen beyond a position of the electron beam at all, the distance that the specimen is moved beyond the position of the electron beam may be approximately equal to a dimension of the electron beam in the direction of the swath length. As such, the stage may have a range of movement that is given by the size of the specimen rather than a range of movement that is larger (e.g., 2× larger) than the size of the specimen thereby providing a tighter structure for the system.

The above described differences between a continuous motion/uniform velocity system and a continuous motion/non-uniform velocity system are shown in FIGS. 4-7. In particular, FIGS. 4-7 illustrate the contrasts between a conventional constant velocity scan and an embodiment of a sinewave/continuously accelerating scan. For example, FIG. 4 illustrates a constant velocity scan of an electron beam over a specimen. In particular, as shown in FIG. 4, for swath 56 having a swath width, $s_w$, and a distance, $d_i$, of the swath on the specimen, a stage (not shown in FIG. 4) moves such that an electron beam (not shown in FIG. 4) is arranged at position 58 beyond an outer edge of specimen 60, having a radius R. The stage then moves such that the electron beam is positioned over specimen 60 where swath 56 begins. While the electron beam is positioned beyond an outer edge of specimen 60, the stage supporting the specimen decelerates or accelerates (i.e., moves at a non-uniform velocity) until it reaches a constant velocity, $v_i$, such that writing or inspection can be performed across swath 56 at the constant velocity. In this manner, the constant velocity scan during write is followed by no write with acceleration/deceleration of the stage velocity for stage reversal.

The distance between position 58 and the outer edge of specimen 60 is determined based on the acceleration, a, of the stage and the time, $t_{rvi}$, required for the constant velocity of the stage to be re-established. As shown in FIG. 4, position 58 can be well beyond the outer edge of specimen 60. It is noted that while the position of the electron beam is beyond the outer edge of specimen 60, the electron beam may not actually be directed through the projection subsystem since no write is performed at these positions.

After the constant velocity of the stage is achieved, the electron beam is scanned across swath 56 on specimen 60, as shown in FIG. 4. Once the swath has been scanned by the electron beam, the stage again has to move such that the electron beam is positioned beyond the outer edge of specimen 60 such that the velocity of the specimen can be reversed for the next swath. During this reversal of the stage velocity, the stage again accelerates such that the position of the electron beam with respect to specimen 60 moves from the outer edge of the specimen to position 62 beyond the outer edge of the specimen. The position of the electron beam with respect to the specimen may be moved from the end of swath 56 to position 62 such that the stage and the specimen are positioned far enough away from the electron beam such that a constant velocity of the stage can be re-attained when the electron beam is positioned at the beginning of the next swath. As such, the distance between the outer edge of specimen 60 and position 62 may be determined as described above. Therefore, the stage has to move such that the electron beam is positioned well beyond the outer edge of the specimen on both ends of swath 56. Consequently, the entire length across which the stage must move for a single swath is much greater than the length, $d_i$, of the actual swath on the specimen.

Obviously, such movement of the stage will affect the throughput of the process performed by the system. For example, as shown in the plots of FIG. 5, for a constant velocity write of a specimen performed as shown in FIG. 4, acceleration, a, varies over time in a step wise manner. In other words, the acceleration is a step function of time. The step changes in the acceleration over time correspond to the acceleration of the stage that takes place before or after writing a swath on a wafer and the constant velocity at which the swath is written on the wafer. (For constant velocity, acceleration is 0.) In other words, for position, $x_i$, of the electron beam with respect to the specimen (where $x_i$ is shown in FIG. 6) across the entire swath, $a(x)=a$ if $|x|>d_i/2$. Otherwise, $a=0$. In this manner, when the electron beam is positioned beyond the specimen, the stage accelerates. When the electron beam is positioned above the specimen, the stage is moved with constant velocity.

In this manner, as shown in FIG. 5, in the plot of velocity as a function of time, the velocity changes during times in which the acceleration is non-zero. In addition, the velocity is constant at times during which the acceleration is zero. The velocity vector of the stage is constant in magnitude but opposite in direction from one swath to the next since adjacent swaths are written in opposite directions. As shown in the plot of position, x, of the electron beam with respect to the specimen, during acceleration, the electron beam is positioned beyond the outer edges of the specimen. The example shown in FIG. 5 is for actual swath lengths, di, of 300 mm. As further shown in FIG. 5, the entire distance across which the stage has to move for a single swath includes more than about 50 mm on both sides of the actual swath on the specimen. Therefore, although the length of the swath actually on the specimen is only 300 mm, the stage has to move across an entire distance of at least 400 mm for the single swath. In addition, as shown in FIG. 5, during acceleration, no write is performed while during constant velocity (no acceleration) write is performed.

In the above described example, the time to write an entire wafer, $T(v_i)=6.99 \text{ sqrt}(R^3/a)/S_w$ (where sqrt is square root). The time to write an entire wafer may be even longer if acceleration of the stage during stage reversal is reduced or the time in which the stage reversal is performed is increased to thereby reduce any disturbances in the movement of the stage during write that may be caused by the acceleration. For example, to reduce jerking of the stage, the rate of acceleration of the stage during stage reversal may be reduced by 30%. In such an example, the time to write an entire wafer becomes $9.09 \text{ sqrt}(R^3/a)/S_w$.

In one embodiment, the non-uniform velocity at which the specimen is moved in the system embodiments described herein varies approximately sinusoidally. One example of such a scan is illustrated in FIGS. 6 and 7. In particular, FIG. 6 illustrates a non-uniform velocity scan of an electron beam over a specimen. As shown in FIG. 6, for swath 64 having a swath width, $s_w$, and a distance, $d_i$, on the specimen, a stage (not shown in FIG. 6) is moved such that a position of an electron beam (not shown in FIG. 6) with respect to specimen 68 moves from position 66 located at the outer edge of specimen 68, having a radius R, where the swath begins to position 70 located at the outer edge of specimen 68 where the swath ends. In addition, the stage may move such that the electron beam is positioned just beyond positions 66 and 70 between different swaths. Therefore, the entire distance across which the stage has to move for a single swath may be approximately equal to a distance, $d_i$, of the swath or slightly larger than the distance of the swath to allow for movement of the stage in the direction opposite to the swath length, $d_i$, such that the electron beam can be positioned at the beginning of the next swath on the specimen.

Since the swath length, $d_i$, will not be greater than a dimension of the specimen in the direction of the swath length, in some embodiments, the stage is configured to move the specimen over a distance that is not greater than approximately a size of the specimen. As such, the entire distance across which a stage has to move for a single swath in a non-uniform velocity scan is much smaller than the entire distance across which a stage has to move for a single swath in a uniform velocity scan. Consequently, the spatial requirements for the stage in an electron beam system (e.g., a lithography system or an inspection system) may be lower for a non-uniform velocity scan due to the reduced range of movement of the stage.

Such reduction in the range of movement of the stage is due to the fact that the scan is performed with a non-uniform velocity. Therefore, the stage does not have to move between swaths during a time when constant velocity of the stage is being reestablished. Instead, writing or inspection of specimen 68 can be performed during acceleration and deceleration of the stage by controlling one or more characteristics of the electron beam as described further herein based on the non-uniform velocity of the stage. In addition, since writing or inspection can be performed during acceleration and deceleration of the stage, a scan that is performed with non-uniform velocity will have a much higher throughput than a scan that is performed with a constant velocity. For example, a scan of a specimen that is performed with a non-uniform velocity may be about 20% to about 50% faster than a scan of the same specimen with a constant velocity.

As shown in the plots of FIG. 7, for a non-uniform velocity scan of a specimen performed as shown in FIG. 6, acceleration, a, of the stage varies approximately constantly over time, unlike the step wise manner in which acceleration varies for a constant velocity scan as shown in FIG. 5. The maximum and minimum values of the magnitude of the acceleration shown in FIG. 7 may be achieved at opposite outer edges of the specimen. In addition, the maximum rate of change of the acceleration is achieved at approximately the midway point of the swath. The acceleration may be a function of the position of the electron beam on the specimen, $x_i$, which is shown in FIG. 6. In particular, $a(x)=a \sin(\omega_i t)$, where $\omega=\mathrm{sqrt}(a/x_i)$.

The vertical lines drawn through all three plots of FIG. 7 illustrate the times at which a scan either ends of begins. Therefore, in the plots shown in FIG. 7, the writing for one swath begins at about 0.45 sec and proceeds to about 1.2 sec. As further shown in FIG. 7, the stage reversal between swaths takes about 0.1 seconds or less. In contrast, the stage reversal for a constant velocity scan takes about 0.5 seconds or more, as shown by the vertical lines drawn through the plots of FIG. 5. Therefore, the stage reversal time for a non-uniform velocity scan may be about 5× lower than the stage reversal time for a constant velocity scan.

As further shown in the plots of FIG. 7, the velocity of the stage changes approximately continuously during writing of the swath on the specimen. The velocity has a maximum value at about the midway point through the swath. As further shown in FIG. 7 in the plot of position, x, of the electron beam with respect to the specimen over time, during acceleration and deceleration, the electron beam is positioned over the specimen. In addition, as shown in this plot, the electron beam is not substantially, if at all, moved beyond the outer edge of the specimen between swaths.

In the above described example, the time to write an entire wafer, $T(\omega_i)=5.49 \ \mathrm{sqrt}(R^3/a)/S_w$. Therefore, the write duty cycle is much higher for a continuously accelerating scan than for a conventional constant velocity scan. In the non-uniform velocity scan shown in FIGS. 6 and 7, a sine wave drive was used as an example of a drive that can move the stage with continuous acceleration. The sine wave drive excites only that harmonic of parasitic resonances in the stage. However, a somewhat higher throughput may be achieved by adding a few higher odd harmonics (e.g., 3rd harmonic, etc.) to increase the average scanning velocity.

As shown in FIGS. 6 and 7, the acceleration of the stage may be changed substantially continuously. In this manner, the rate of change of the acceleration may not be high in comparison to the rate of change of the acceleration of the stage during stage reversal as currently performed and shown in FIGS. 4 and 5, where the acceleration goes from 0 to some relatively high, maximum value of acceleration almost instantly. Changing the acceleration slower results in slower changes in the forces on the system. For example, with sinusoidal changes in the acceleration, the frequency of the sinusoid will depend on the width of the specimen (e.g., the distance across which the acceleration varies), and examples of values for the frequency of the sinusoid may typically be about 1 Hz to about 3 Hz, with a maximum value of about 10 Hz. In addition, in typical stages, the mechanical resonances of the stage may be excited at frequencies of about 100 Hz to about 500 Hz. Therefore, the frequency content of the changes experienced by the stage of the system embodiments described herein may be substantially lower than the frequencies that excite mechanical resonances in the stage thereby avoiding creating such resonances in the stage that may cause ringing.

In contrast, changing the acceleration from 0 to 2000 mm/sec$^2$ almost instantly as shown in FIG. 5 may result in a frequency of about 1 kHz applied to the stage. Therefore, such a frequency will excite all of the mechanical resonances of the stage thereby causing ringing of the stage. Even if mechanical damping techniques are applied to the stage, such resonances in the stage must be allowed to subside before writing can begin during constant velocity scans thereby contributing to the low throughput of these systems. As such, the continuously changing acceleration of the stage as described herein provides additional advantages over the currently used electron beam systems.

Referring back to FIG. 1, as described above, control subsystem 54 is configured to alter one or more characteristics of the electron beam during projection of the electron beam onto specimen 10. The one or more characteristics of the electron beam are preferably altered based on the non-uniform velocity at which the specimen is moved by stage 12. In one such embodiment, control subsystem 54 is configured to alter the one or more characteristics of the electron beam such that a dose of the electron beam projected onto the specimen is substantially constant during movement of the specimen at the non-uniform velocity. In this manner, although writing (in the case of lithography) takes place during substantial acceleration of the stage, the control subsystem may alter the beam current to which the specimen is exposed to maintain a substantially constant dose to the resist on the specimen. Therefore, the writing duty cycle can be improved to close to 100%.

The dose can be altered by the control subsystem in any manner known in the art. For example, the control subsystem may be coupled to one or more components of projection subsystem 14. In particular, the control subsystem may be coupled to electron gun 16, illumination optics 18, and/or DPG 24. In such examples, the control subsystem may be coupled to each of these components by a transmission medium. The transmission medium may include any suitable transmission medium known in the art.

In this manner, the control subsystem may be configured to control one or more parameters of the component(s) to thereby alter the dose to which the specimen is exposed. Therefore, the one or more parameters of the component(s) of the projection subsystem may be effectively controlled based on the non-uniform velocity of the stage. In one such example, the control subsystem may send signals to component(s) of the projection subsystem such that the one or more parameters may be altered by the component(s) themselves (e.g., by controllers integrated into or coupled to the component(s)). Alternatively, the control subsystem may be configured to alter one or more parameters of the component(s) directly. Appropriate parameters for the component(s) of the projection subsystem can be determined empirically or dynamically by the control subsystem (e.g., based on the selected dose, information about the movement of the specimen which can be determined dynamically or empirically as described further herein, and one or more relationships between the dose and the parameter(s) of the component(s)).

In one such example, the control subsystem may be configured to alter the dose to the specimen by altering one or more parameters of electron gun 16 to thereby alter the beam current that is generated by electron gun 16. In another example, the control subsystem may be configured to alter the dose to which the specimen is exposed by altering one or more parameters of illumination electron-optics 18 to thereby alter the current illuminating DPG 24. In such an example, the signals responsive to the acceleration of the stage may be fed into the illumination optics by the control subsystem such that one or more parameters of the illumination optics can be adjusted to scale the beam current with the varying velocity such that the net dose to the specimen is substantially the same over time. In a further example, the control subsystem may be configured to alter one or more parameters of DPG 24 to alter the dose to the specimen. For example, the control subsystem may be configured to alter the voltages that are applied to the individual pixels of the DPG. In this manner, gray levels may be generated on one or more of the pixels such that the one or more pixels reflect electrons but in a lower amount than a fully on pixel. Such gray levels may be generated by controlling the rate at which the image on the DPG "rolls" or moves across the DPG.

In another embodiment, the one or more characteristics of the electron beam that are altered by the control subsystem include a pattern in which the electron beam is projected onto the specimen. In particular, the control subsystem may be coupled to DPG 24 as described above. In this manner, the control subsystem may alter the clock shifting rate of the DPG such that the pattern in which the electron beam is projected onto the specimen is changed in accordance with (e.g., is scaled with) the non-uniform velocity at which the specimen is being moved. In this manner, the control subsystem may be configured to alter the data age of the pattern on the DPG that is transferred to the electron beam.

The alteration of the dose and the data age as described above may also take into account the delay between when the electron beam is incident on the DPG and when the electron beam is incident on the specimen. Such delay may be relatively constant and may be determined based on prior measurements (e.g., calibration of the system). Therefore, the control subsystem may take into account this delay when altering the pattern in which the electron beam is projected onto the specimen, the dose, or any other characteristic of the electron beam that is altered to compensate for the non-uniform velocity of the stage.

In addition, the beam current (e.g., dose) and the pattern in which the electron beam is projected onto the specimen may be altered simultaneously. For example, the control subsystem may be configured to control the electron beam current based on the non-uniform velocity of the stage including higher order corrections from data age. Furthermore, the control subsystem may be configured to dynamically alter the clocking to link the writing pattern to position of the specimen including higher order corrections.

In an additional embodiment, the control subsystem is configured to alter the one or more characteristics of the electron beam to compensate for heating of the specimen by the electron beam. Heating of the specimen may alter the position of the electron beam on the specimen (e.g., due to expansion of the specimen caused by the heating). In this manner, the first swath may be written on the specimen while the specimen is relatively "cold." However, the specimen may be relatively heated during the first swath, and expansion of the wafer caused by such heating may alter the actual position at which subsequent swaths are written on the wafer. Therefore, the position of the electron beam with respect to the specimen may be determined by the control subsystem as described further herein (e.g., dynamically or using predetermined data), and the characteristic(s) of the electron beam can be altered accordingly by the control subsystem. For instance, the heating and resulting expansion of the specimen may be relatively predictable and/or repeatable and may be determined empirically (e.g., from electrical characteristics of the materials of the specimen, coefficients of thermal expansion of the materials, etc.) or experimentally as described herein. Therefore, the position of the pattern projected on the specimen may be "expanded" to match the expansion of the specimen.

In each of the above-described embodiments, the control subsystem preferably alters one or more characteristics of the electron beam based on the non-uniform velocity. In this manner, the control subsystem may be configured to determine the non-uniform velocity as a function of time such the characteristic(s) of the electron beam can be altered accordingly over time. In some embodiments, the control subsystem may be configured to determine the non-uniform velocity dynamically (e.g., during the projection of the electron beam onto the specimen) or to determine the non-uniform velocity from predetermined data. For example, the control subsystem may be configured to monitor the position of the stage and/or the specimen, the stage velocity, the stage acceleration, higher derivatives (of acceleration, e.g., jerk), or some combination thereof. In addition, the control subsystem may be configured to determine a position of the electron beam with respect to the stage and/or the specimen. This information may be acquired by the control subsystem dynamically as described further herein. Alternatively, this information may be acquired by or provided to the control subsystem prior to projecting the electron beam onto the specimen as described further herein. In this manner, the information acquired in either manner may be used to compensate for movement of the specimen with respect to the electron beam during writing or inspection by altering one or more characteristics of the electron beam.

In one embodiment, the control subsystem is configured to dynamically determine a position of the specimen with respect to the electron beam during movement of the specimen. In such an embodiment, the control subsystem is configured to alter the one or more characteristics of the electron beam based on the determined position of the specimen with respect to the electron beam. As such, the control subsystem may be configured to dynamically track errors in the specimen position caused by the non-uniform velocity. Therefore, the control subsystem is configured to provide tight feedback between the final lens of the projection subsystem and the specimen.

In some such embodiments, on-board servo marks on the specimen may be used to track the position of the specimen with respect to the electron beam. The servo marks may include, for example, servo tracks that can be used as a guide for writing or inspection of the specimen. In other cases, pre-existing geometry on the specimen can be used to determine a position of the specimen with respect to the electron beam. The pre-existing geometry may include, for example, "streets" or scribe lines formed on the specimen (e.g., a wafer).

In one embodiment, therefore, the specimen includes servo patterns. The servo patterns may be relatively sparse. In such an embodiment, the control subsystem includes a measurement subsystem configured to intermittently generate output signals responsive to the servo patterns. The measurement subsystem may include an optical subsystem or an electron beam subsystem, both of which may be configured as described further herein. The measurement subsystem may be configured to generate the output signals during movement of the specimen by the stage (e.g., dynamically during lithography or inspection) or before the process performed on the specimen by the projection subsystem. The output signals may be generated intermittently, for example, at sufficiently frequent intervals to provide position data about the stage or the specimen. In this manner, the output signals may not be continuously generated during movement of the specimen by the stage. In addition, the control subsystem is configured to determine a position of the specimen or the stage from two or more output signals. For example, the control subsystem may include a phase locked loop or other timing and interpolation subsystem so that a position of the stage or the specimen can be inferred at any time by combining two or more of these output signals.

Obviously, there will be a delay between when the stage or specimen position is measured and when the stage position is determined due to the electronic components of the control subsystem. Such a delay may be relatively small (e.g., about 100 ns to about 300 ns), but can be accounted for by the control subsystem to provide even more accurate writing or inspection of the specimen. For example, such delay may be relatively constant and may be determined based on information about the control subsystem and/or prior measurements (e.g., calibration of the system). Therefore, the control subsystem may take into account this delay when altering the pattern in which the electron beam is projected onto the specimen, the dose, or any other characteristic of the electron beam that is altered to compensate for the non-uniform velocity of the stage.

In some embodiments, the control subsystem includes an optical subsystem that is configured to dynamically determine a position of the specimen with respect to the electron beam during movement of the specimen. In one such embodiment, the optical subsystem may be configured as an interferometer or any other suitable optical subsystem known in the art such as a reflection-based imaging subsystem. In any case, the optical subsystem may be used to perform measurements on the stage or a component coupled to the stage (e.g., a mirror). Alternatively, the optical subsystem may be used to perform measurements directly on the specimen. In addition, the optical subsystem may be used, in some embodiments, to determine lens to specimen positions due to distortions from pattern dependent heating of the specimen by the electron beam.

One embodiment of a control subsystem that includes an optical subsystem configured as described above and a system in which the control subsystem is included is illustrated in FIG. 8. In this embodiment, optical subsystem 72 is configured as an interferometer. In particular, optical subsystem 72 includes light source 74 that is configured to generate light. Light source 74 may include any appropriate light source known in the art. Optical subsystem 72 also includes beam splitter 76. Beam splitter 76 may be configured to split the light generated by light source 74 into two different beams (i.e., a sample beam and a reference beam) having approximately equal intensity. Beam splitter 76 may include any appropriate beam splitter known in the art.

The sample beam is directed to specimen 10, and the reference beam is directed to reflective component 78. Reflective component 78 may include any suitable reflective component known in the art (e.g., a flat mirror). In addition, reflective component 78 may be positioned a known distance from beam splitter 76, and the position of reflective component 78 with respect to the beam splitter may be substantially constant.

After the sample and reference beams have been reflected by the specimen and the reflective component, respectively, the sample and reference beams may be combined at beam splitter 76. In this manner, the sample and reference beams will interfere with each other. In addition, the interference between the sample and reference beams will vary depending on the difference between the distance that the sample beam traveled from the beam splitter to the specimen and back again and the distance that the reference beam traveled from the beam splitter to reflective component 78 and back again.

After the sample and reference beams have been combined, the combined beam is directed to detector 80. Detector 80 may include any suitable detector known in the art. Detector 80 may be configured to generate output signals (not shown) that are responsive to the interference between the beams. In addition, detector 80 may be coupled to control subsystem 54 as described above. In this manner, the control subsystem may receive the output signals from the detector and may be configured to use the output signals to determine a position of specimen 10.

Although optical subsystem 72 is shown in FIG. 8 spaced laterally from projection subsystem 14, the optical subsystem is only shown in this manner to allow the individual components of the optical subsystem to be illustrated clearly in the figure. It is to be understood that the optical subsystem may be arranged at any suitable position with respect to the projection subsystem. In addition, it may be preferable to arrange the optical subsystem such that it is coupled to (e.g., mounted on) the projection subsystem. In this manner, the position of the optical subsystem with respect to the electron beam projected by the projection subsystem onto the specimen may be substantially constant. As such, the positional information generated by the optical subsystem may be used to determine the position of the specimen with respect to the electron beam with high accuracy. In some such configurations, the optical subsystem may be coupled to a surface of the projection subsystem closest to the specimen. One such configuration of an optical subsystem is illustrated in U.S. Pat. No. 6,870,172 to Mankos et al., which is incorporated by reference as if fully set forth herein.

Additional configurations of an optical subsystem that may be included and used in embodiments described herein are illustrated in U.S. Pat. No. 6,687,008 to Peale et al. and U.S. patent application Ser. No. 10/163,172 filed Jun. 4, 2002 and published as U.S. Patent Application Publication No. 2004/0039760 by Hess et al., Ser. No. 10/395,051 filed Mar. 22, 2003 and published as U.S. Patent Application Publication No. 2004/0125488, by Zhu et al., 60/665,771 filed Mar. 28, 2005 by Peale et al., and 11/130,830 filed May 17, 2005 and published as U.S. Patent Application Publication No. 2006/0262291 by Hess et al., which are incorporated by reference as if fully set forth herein.

Optical subsystem 72 and the systems described herein may be further configured as described in this patent and these patent applications. The control subsystem, the projection subsystem, and the system shown in FIG. 8 may be further configured as described herein.

In a different embodiment, the control subsystem includes an electron beam subsystem that is configured to dynamically determine a position of the specimen with respect to the electron beam during movement of the specimen. The electron beam subsystem may include an electron beam used in conjunction with a secondary collector (not shown). In some embodiments, the electron beam used with the secondary collector may be the electron beam of the projection subsystem. In this manner, the secondary collector may be configured to detect electrons that are reflected and/or scattered from the specimen during write or inspection. The secondary collector may be arranged in any suitable position within the system (e.g., coupled to a surface of the projection subsystem located closest to the specimen). The electron beam subsystem may be used, in some embodiments, to detect the shifted positions of the electron beam on the specimen due to pattern dependent electron beam heating of the specimen.

Figure 9:
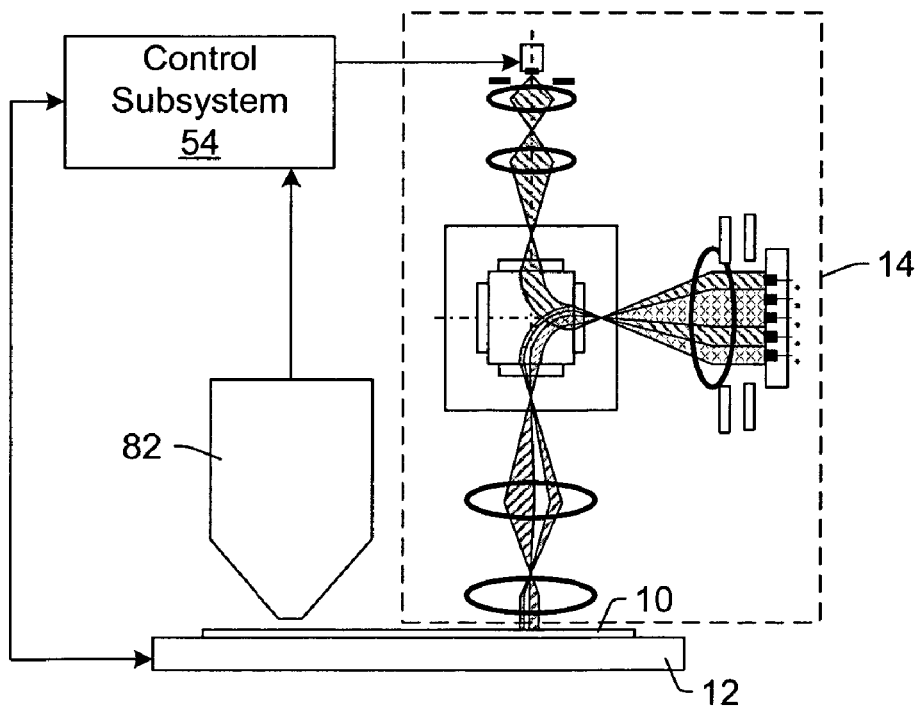

One embodiment of a control subsystem that includes an electron beam subsystem configured as described above and a system in which the control subsystem is included is illustrated in FIG. 9. In this embodiment, the electron beam subsystem includes electron column 82. Electron column 82 may be configured to direct electrons onto specimen 10 and to collect electrons reflected and/or scattered from specimen 10. In addition, electron column 82 may be configured to generate output signals in response to the collected electrons. The electron column may be coupled to control subsystem 54 as described above. In this manner, the control subsystem may be configured to receive the output signals from the electron column and to use the output signals to determine a position of specimen 10.

Although electron column 82 is shown in FIG. 9 to be spaced laterally from projection subsystem 14, it is to be understood that the electron column may be arranged within the system in a number of different ways. For example, projection subsystem 14 may be configured as a multi-column projection subsystem in some embodiments. In such embodiments, one of the columns of the projection subsystem may be used to determine positional information about the specimen.

In addition, although embodiments of a control subsystem that include an optical subsystem or an electron beam subsystem to dynamically determine a position of a specimen with respect to an electron beam are described herein, it is to be understood that any other position, velocity, and/or acceleration measurement devices may be arranged in various locations with respect to the projection subsystem to form the most accurate proxy to the actual beam-to-specimen position. For example, as shown in FIG. 1, control subsystem 54 may be coupled to stage 12 as described above. In this manner, the control subsystem may be configured to receive and/or access information from one or more components of the stage that can be used to determine a position of the stage, and therefore the specimen, with respect to the electron beam. The control subsystem, the projection subsystem, and the system shown in FIG. 9 may be further configured as described herein.

In a different embodiment, the control subsystem is configured to determine a position of the specimen with respect to the electron beam during movement of the specimen using predetermined empirical data. In such a pre-characterized case (which will work for repeatable errors), a specimen (e.g., a wafer) written with precision rules can be used to empirically map all of the distortions of the wafer position resulting from the accelerations, strain on the mount, stage, etc. In addition, distortions from pattern dependent electron beam heating of the specimen can also be mapped in this manner.

For example, a wafer may be written by the system, and an image of the specimen may be acquired (e.g., either dynamically or subsequent to the writing). In such embodiments, a detector such as the optical subsystem and electron beam subsystem described above may be used to read such a ruled calibration wafer. The image of the specimen may then be compared to a map indicating spatial characteristics of the pattern that was projected by the projection subsystem (e.g., the ideal pattern on the wafer). In this manner, differences in the specimen image and the map may indicated distortion of the pattern on the wafer. Such distortions may be caused by heating of the specimen, stage movement, characteristics of the electron-optics of the projection subsystem, etc. In addition, characteristics of the differences may be used to determine which distortions caused which differences. For example, a distortion caused by heating of the wafer may have different characteristics than a distortion caused by an error in the stage movement (e.g., a jerk).

Therefore, the differences may be used to create a spatial error map, which can be used to eliminate predictable or repeatable errors. In this manner, a spatial error map may be created a priori using a ruled calibration specimen (e.g., wafer). The control subsystem may be configured to convert such a map to a feed forward map for fine stage and/or electron beam positioning during write or inspection.

The control subsystems described herein are also advantageous in that they can be incorporated into existing electron beam systems (not shown) such as lithography systems and inspection systems. In addition, the stages of existing electron beam systems, into which the control subsystems described herein are incorporated, may be replaced with stages that can be moved with a non-uniform velocity during write or inspection. In this manner, existing electron beam systems may be retrofitted with a control subsystem as described herein such that the electron beam systems can have the advantages described herein.

One embodiment, therefore, relates to a control subsystem that is configured to be coupled to an electron beam projection system. The control subsystem is also configured to alter one or more characteristics of an electron beam projected onto a specimen by the electron beam projection system during movement of the specimen at a non-uniform velocity. The control subsystem may be further configured as described herein and shown in the figures as control subsystem 54.

In some existing systems, it may be possible to alter the configuration of an existing control subsystem of the systems to perform the functions described herein. For instance, a processor of an existing control subsystem may be modified to perform one or more functions of the control subsystems described herein. Such a processor may be included in a computer system. The computer system may take various forms, including a personal computer system, mainframe computer system, workstation, or any other device known in the art. In general, the term "computer system" may be broadly defined to encompass any device having one or more processors, which executes instructions from a memory medium.

Therefore, in existing control subsystems, the instructions that are executed by the processor may be modified to perform one or more functions of the control subsystems described herein. Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or image acquisition disk, or a magnetic tape.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Another embodiment relates to a method for projecting an electron beam onto a specimen. The method includes moving the specimen with a non-uniform velocity. The method also includes projecting the electron beam onto the specimen during movement of the specimen at the non-uniform velocity. In addition, the method includes altering one or more characteristics of the electron beam during projection of the electron beam onto the specimen based on the non-uniform velocity.

In one embodiment, the non-uniform velocity varies approximately sinusoidally. In another embodiment, moving the specimen is performed over a distance that is not greater than approximately a size of the specimen.

In an additional embodiment, altering the characteristic(s) of the electron beam includes altering one or more characteristics of the electron beam such that a dose of the electron beam is substantially constant during projection of the electron beam onto the specimen. In another embodiment, the characteristic(s) of the electron beam include a pattern in which the electron beam is projected onto the specimen. In a further embodiment, altering the characteristic(s) of the electron beam includes altering one or more characteristics of the electron beam to compensate for heating of the specimen by the electron beam.

In some embodiments, the method includes dynamically determining a position of the specimen with respect to the electron beam during movement of the specimen. In other embodiments, the method includes determining a position of the specimen with respect to the electron beam during movement of the specimen using predetermined empirical data.

Each of the steps of the method embodiments described above may be performed as described further herein. In addition, each of the embodiments of the method described above may include any other step(s) described herein. Furthermore, each of the embodiments of the method described above may be performed by one or more of the systems described and illustrated herein.

Further modifications and alternative embodiments of various aspects of the invention may be apparent to those skilled in the art in view of this description. For example, systems, control subsystems, and methods for projecting an electron beam onto a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to project an electron beam onto a specimen, comprising:
   a stage configured to move the specimen with a non-uniform velocity;
   a projection subsystem configured to project the electron beam onto the specimen while the stage is moving the specimen at the non-uniform velocity; and
   a control subsystem configured to alter one or more characteristics of the electron beam while the projection subsystem is projecting the electron beam onto the specimen based on the non-uniform velocity.

2. The system of claim 1, wherein the system is further configured as a lithography system.

3. The system of claim 1, wherein the system is further configured as an inspection system.

4. The system of claim 1, wherein the non-uniform velocity varies approximately sinusoidally.

5. The system of claim 1, wherein the stage is further configured to move the specimen over a distance that is not greater than approximately a size of the specimen.

6. The system of claim 1, wherein the control subsystem is further configured to alter the one or more characteristics of the electron beam such that a dose of the electron beam projected onto the specimen is substantially constant during said moving.

7. The system of claim 1, wherein the one or more characteristics of the electron beam comprise a pattern in which the electron beam is projected onto the specimen.

8. The system of claim 1, wherein the control subsystem is further configured to alter the one or more characteristics of the electron beam to compensate for heating of the specimen by the electron beam.

9. The system of claim 1, wherein the control subsystem is further configured to dynamically determine a position of the specimen with respect to the electron beam during said moving.

10. The system of claim 1, wherein the control subsystem comprises an optical subsystem configured to dynamically determine a position of the specimen with respect to the electron beam during said moving.

11. The system of claim 1, wherein the control subsystem comprises an electron beam subsystem configured to dynamically determine a position of the specimen with respect to the electron beam during said moving.

12. The system of claim 1, wherein the control subsystem is further configured to determine a position of the specimen with respect to the electron beam during said moving using predetermined empirical data.

13. The system of claim 1, wherein the specimen comprises servo patterns, wherein the control subsystem comprises a measurement subsystem configured to intermittently generate output signals responsive to the servo patterns, and wherein the control subsystem is further configured to determine a position of the specimen or the stage from two or more of the output signals.

14. A control subsystem configured to be coupled to an electron beam projection system, wherein the control subsystem is further configured to alter one or more characteristics of an electron beam projected onto a specimen by the electron beam projection system during movement of the specimen at a non-uniform velocity.

15. A method for projecting an electron beam onto a specimen, comprising:
   moving the specimen with a non-uniform velocity;
   projecting the electron beam onto the specimen during said moving; and
   altering one or more characteristics of the electron beam during said projecting based on the non-uniform velocity.

16. The method of claim 15, wherein the non-uniform velocity varies approximately sinusoidally.

17. The method of claim 15, wherein said moving is performed over a distance that is not greater than approximately a size of the specimen.

18. The method of claim 15, wherein said altering comprises altering the one or more characteristics of the electron beam such that a dose of the electron beam is substantially constant during said projecting.

19. The method of claim 15, wherein the one or more characteristics of the electron beam comprise a pattern in which the electron beam is projected onto the specimen.

20. The method of claim 15, wherein said altering comprises altering the one or more characteristics of the electron beam to compensate for heating of the specimen by the electron beam.

21. The method of claim 15, further comprising dynamically determining a position of the specimen with respect to the electron beam during said moving.

22. The method of claim 15, further comprising determining a position of the specimen with respect to the electron beam during said moving using predetermined empirical data.

23. The method of claim 15, wherein the specimen comprises servo patterns, and wherein the method further comprises intermittently generating output signals responsive to the servo patterns and determining a position of the specimen or the stage from two or more of the output signals.

* * * * *

UNITED STATES PATENT AND TRADEMARK OFFICE
CERTIFICATE OF CORRECTION

PATENT NO.        : 7,342,238 B2                                    Page 1 of 1
APPLICATION NO.   : 11/198985
DATED             : March 11, 2008
INVENTOR(S)       : Zywno et al.

It is certified that error appears in the above-identified patent and that said Letters Patent is hereby corrected as shown below:

On the title page, item:

(73) Assignee: please delete "KLA-Tenor" and substitute -- KLA-Tencor --.

Signed and Sealed this

Thirty-first Day of March, 2009

JOHN DOLL
*Acting Director of the United States Patent and Trademark Office*